(12) United States Patent
Lee et al.

(10) Patent No.: US 7,714,313 B2
(45) Date of Patent: May 11, 2010

(54) RESISTIVE RAM HAVING AT LEAST ONE VARISTOR AND METHODS OF OPERATING THE SAME

(75) Inventors: Jung-Hyun Lee, Yongin-si (KR);
Eun-Hong Lee, Anyang-si (KR);
Sang-Jun Choi, Yongin-si (KR);
In-Kyeong Yoo, Suwon-si (KR);
Myoung-Jae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 573 days.

(21) Appl. No.: 11/655,086

(22) Filed: Jan. 19, 2007

(65) Prior Publication Data
US 2007/0165434 A1  Jul. 19, 2007

(30) Foreign Application Priority Data
Jan. 19, 2006  (KR) ...................... 10-2006-0005840

(51) Int. Cl.
*H01L 47/00* (2006.01)
(52) U.S. Cl. .............................................. 257/4; 257/5
(58) Field of Classification Search ................. 257/2–5, 257/E45.002
See application file for complete search history.

(56) References Cited

U.S. PATENT DOCUMENTS 7,465,951 B2 *  12/2008  Scheuerlein .................. 257/3
7,615,771 B2 *  11/2009  Fontana et al. ................. 257/5

* cited by examiner

*Primary Examiner*—Cuong Q Nguyen
(74) *Attorney, Agent, or Firm*—Harness, Dickey & Pierce, P.L.C.

(57) ABSTRACT

Resistive memory devices having at least one varistor and methods of operating the same are disclosed. The resistive memory device may include at least one bottom electrode line, at least one top electrode line crossing the at least one bottom electrode line, and at least one stack structure disposed at an intersection of the at least one top electrode line and the at least one bottom electrode line including a varistor and a data storage layer.

28 Claims, 3 Drawing Sheets

RESISTIVE RAM HAVING AT LEAST ONE VARISTOR AND METHODS OF OPERATING THE SAME

PRIORITY STATEMENT

This application claims priority under 35 U.S.C. §119 to Korean Patent Application No. 10-2006-0005840, filed on Jan. 19, 2006, in the Korean Intellectual Property Office (KIPO), the entire disclosure of which is incorporated herein by reference.

BACKGROUND

Example embodiments relate to non-volatile memory devices, for example, to resistive random access memory (RRAM) having at least one varistor.

DESCRIPTION OF THE RELATED ART

RRAM may be characterized by a resistor disposed between a top electrode and a bottom electrode of a storage node. The resistor may have a current-voltage characteristic which may be varied according to an applied voltage. Once the current-voltage characteristic is varied, the varied current-voltage characteristic of the resistor may be maintained until a reset voltage is applied to the resistor. The resistor may be formed of NiO, an ion-conductor, or a dielectric material having a crystal structure of, or substantially similar to, perovskite. NiO may be used to form a unipolar resistor having a switching characteristic appearing in a positive voltage region as shown in FIG. 1. The ion-conductor and the dielectric material may be used to form a bipolar resistor having a switching characteristic appearing in both the positive and negative voltage regions as shown in FIG. 2.

The first graph G1 in FIG. 1 shows an initial state of a current-voltage characteristic of a RRAM having a NiO layer when a voltage is applied to the NiO layer. A second graph G2 in FIG. 1 shows a current-voltage characteristic of a RRAM having a NiO layer when a threshold voltage is applied to the RRAM.

If the current-voltage characteristic of the unipolar resistor, for example a NiO layer resistor, follows the graph G1, the unipolar resistor may be considered to be in a reset state. If the current-voltage characteristic of the unipolar resistor, for example a NiO layer resistor, follows the graph G2, the unipolar resistor may be considered to be in a set state. The reset state and the set state of the unipolar resistor may also be defined reversely.

As the importance of the degree of integration increases, transistors, widely used as switching devices, may be replaced by smaller diodes to aid in increasing the degree of integration of semiconductor devices.

A diode generally allows a current to flow in only one direction, and a substantially smaller or immeasurable current to flow in the other direction. Therefore, in a memory array having a diode as a switching device, a specific memory element may be selected relatively accurately.

When a diode is used as a switching element instead of a transistor in RRAM, the type of resistor that can be used may be limited to a resistor having a unipolar characteristic. Of the aforementioned resistor materials, NiO is one type of material that may be used for RRAM using a diode switching element. Because the ion-conductor and the dielectric material generally have bipolar characteristics, those materials may be used to record or to read data by applying an opposite polarity of voltage. However, if a diode is used, it may be difficult to apply a voltage of opposite polarity because the diode allows current to flow in one direction. Therefore, it may be difficult to use a resistor having bipolar characteristics for a RRAM of the related art using a diode as a switching device.

SUMMARY

Example embodiments may provide a resistive memory device having a bipolar resistor, to which a voltage of different polarities is freely applicable.

Example embodiments may also provide a method of operating the resistive memory device.

Example embodiments may provide a memory device including at least one bottom electrode line, at least one top electrode line crossing the at least one bottom electrode line, and at least one stack structure disposed at an intersection of the at least one bottom electrode line and the at least one top electrode line. The stack structure may include a varistor and a data storage layer.

In an example embodiment, the varistor and the data storage layer may be sequentially stacked on the at least one bottom electrode line.

In an example embodiment, the memory device may further include a first conductive layer between the data storage layer and the at least one top electrode line, and a second conductive layer between the varistor and the at least one bottom electrode line.

In an example embodiment, the varistor and the data storage layer may be sequentially stacked on the at least one top electrode line.

In an example embodiment, the memory device may further include a first conductive layer between the data storage layer and the at least one bottom electrode line, and a second conductive layer between the varistor and the at least one top electrode line.

In an example embodiment, the memory device may further include a floating electrode between the varistor and the data storage layer.

In an example embodiment, the varistor may include two diodes, connected in parallel and in opposite directions.

In an example embodiment, the two diodes may be P-N junction diodes.

In an example embodiment, the varistor may include an NbO layer.

In an example embodiment, the varistor may include at least one of ZnO and $Bi_2O_3$.

In an example embodiment, the data storage layer may be at least one of a unipolar resistor and a bipolar resistor.

In an example embodiment, the bipolar resistor may include $WO_3$.

In an example embodiment, the data storage layer may include at least one of GeTe, GeSe, GeSeTe, and NiO.

In an example embodiment, the at least one top electrode line may include platinum, and the at least one bottom electrode line may include silver.

In an example embodiment, the at least one top electrode line may include a plurality of top electrode lines arranged in parallel and the at least one bottom electrode line may include a plurality of bottom electrode lines arranged in parallel. The plurality of bottom electrode lines may be substantially perpendicular to the plurality of top electrode lines.

In an example embodiment, the at least one stack structure may include a plurality of stack structures, each one of the plurality of stack structures may be disposed at a different intersection of the plurality of bottom electrode lines and the plurality of top electrode lines.

In an example embodiment, the plurality of stack structures may each include a varistor and a data storage layer.

Example embodiments may also provide a method of operating a memory device, including providing the memory device and applying a voltage between the bottom electrode line and the top electrode line. The memory device may include at least one bottom electrode line, at least one top electrode line crossing the at least one bottom electrode line, and at least one stack structure disposed at an intersection of the at least one bottom electrode line and the at least one top electrode line, including a varistor and a data storage layer.

In an example embodiment, the voltage is selected from the group consisting of a write voltage, a read voltage, and an erase voltage.

In an example embodiment, the method may further include measuring a resistance of the memory device by applying a read voltage, and comparing the measured resistance with a reference resistance.

Example embodiments may also provide a method of operating a memory device having a bottom electrode line, a top electrode line crossing the bottom electrode line, and a stack structure disposed between the top electrode line and the bottom electrode line, wherein the stack structure is disposed at an intersection of the top electrode line and the bottom electrode line and may include a varistor and a data storage layer. The method may include applying a voltage between the bottom electrode line and the top electrode line.

In an example embodiment, applying the voltage may include applying a voltage selected from the group consisting of a write voltage, a read voltage and an erase voltage.

In another example embodiment, applying the read voltage may include measuring a resistance of the memory device by applying the read voltage if the voltage is the read voltage, and comparing the measured resistance with a reference resistance.

BRIEF DESCRIPTION OF THE DRAWINGS

The above and/or other features and advantages example embodiments will become more apparent by describing in detail example embodiments with reference to the attached drawings in which.

DETAILED DESCRIPTION OF EXAMPLE EMBODIMENTS

Figure 1:
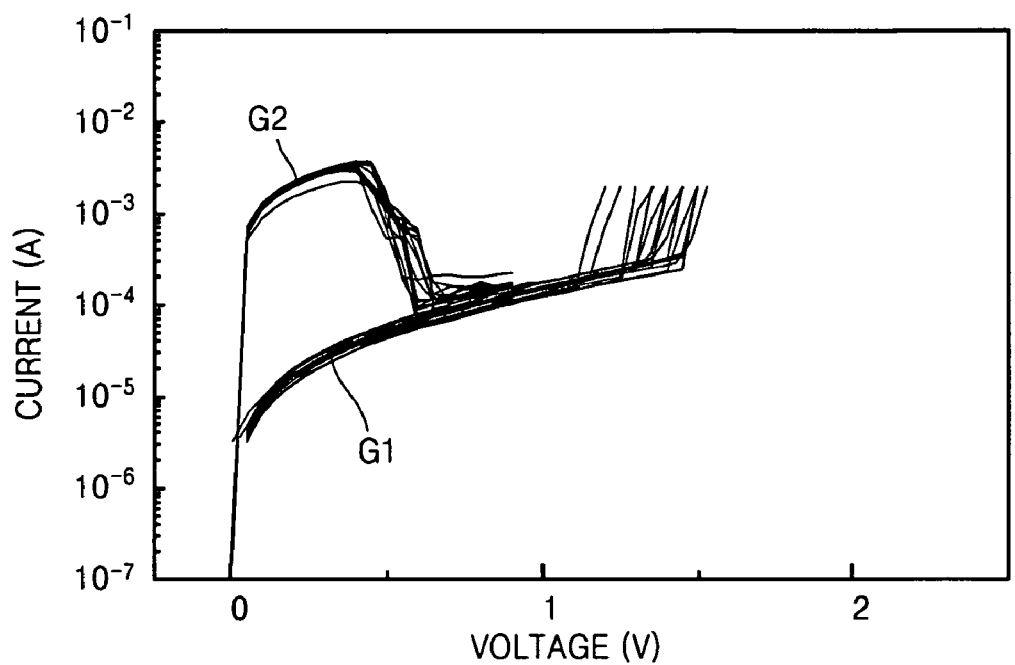
FIG. 1 is a graph showing current-voltage characteristics of a resistive memory device having a unipolar resistor as a data storage layer according to the related art.
Figure 2:
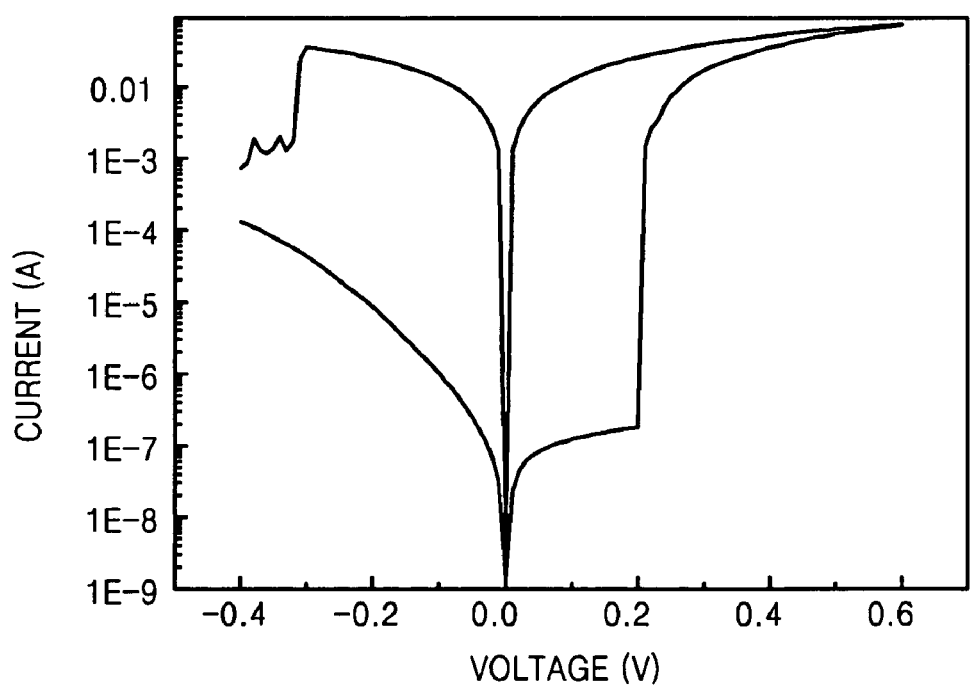
FIG. 2 is a graph showing current-voltage characteristics of a resistive memory device having a bipolar resistor as a data storage layer according to the related art.

Detailed illustrative embodiments are disclosed herein. However, specific structural and functional details disclosed herein are merely representative for purposes of describing example embodiments. Example embodiments may, however, be embodied in many alternate forms and should not be construed as limited to only the example embodiments set forth herein.

It will be understood that if an element or layer is referred to as being "on," "against," "connected to" or "coupled to" another element or layer, then it can be directly on, against connected or coupled to the other element or layer, or intervening elements or layers may be present. In contrast, if an element is referred to as being "directly on", "directly connected to" or "directly coupled to" another element or layer, then there are no intervening elements or layers present. Like numbers refer to like elements throughout. As used herein, the term "and/or" includes any and all combinations of one or more of the associated listed items.

Spatially relative terms, for example "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term for example "below" can encompass both an orientation of above and below. The device may be otherwise oriented (rotated 90 degrees or at other orientations) and the spatially relative descriptors used herein interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Example embodiments will now be described more fully with reference to the accompanying drawings, in which example embodiments are shown. In the drawings, the thicknesses of layers and regions are exaggerated for clarity.

A resistive memory device according to an example embodiment will be described with reference to FIG. 3.

Figure 3:
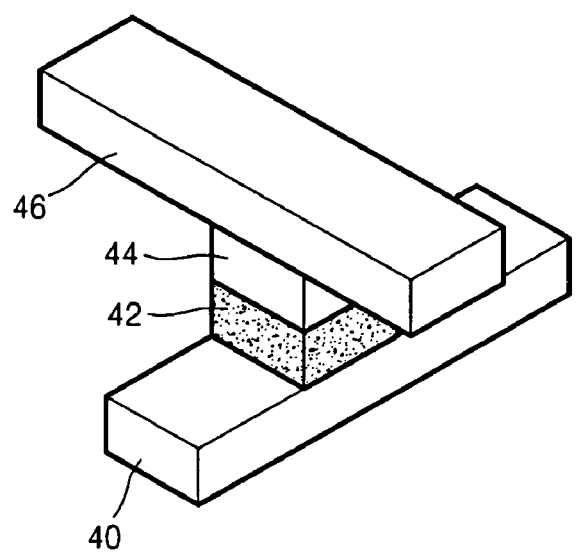
FIG. 3 is a perspective view of a resistive memory device, according to an example embodiment.

Referring to FIG. 3, a varistor 42 and a resistor 44 may be stacked on a bottom electrode 40. The resistor 44 may contact a top electrode 46. The bottom electrode 40 and the top electrode 46 each may be formed in a relatively long line shape and may cross over each other.

In at least one example embodiment, a plurality of bottom electrodes 40 may be formed in parallel and a plurality of top electrodes 46 may be formed in parallel. The plurality of top electrodes may be substantially perpendicular to the plurality of bottom electrodes such that an array is formed. Alternatively, any orientation where intersections between the plurality of top and bottom electrodes are formed may be used. The varistor 42 and the resistor 44 may be placed at intersections between the plurality of bottom electrodes 42 and the plurality of top electrodes 46. By doing so, the memory devices of example embodiments may constitute a memory array. In the memory array, when one of the plurality of bottom electrodes 40 and one of the plurality of top electrodes 46 are selected, the varistor and resistor disposed at the intersection of the one bottom electrode and the one top electrode may be selected.

In FIG. 3, the top electrode 46 is disposed above the bottom electrode 40. However, the top electrode 46 may be disposed under the bottom electrode 40. In this example, the varistor 42 may be formed on the resistor 44. Furthermore, a conductive layer may be interposed between the bottom electrode 40 and the varistor 42. Moreover, a floating electrode and/or a conductive layer may be formed between the varistor 42 and the resistor 44. Additionally, a conductive layer may be further included between the top electrode 46 and the resistor 44.

The varistor 42 may be formed of diodes. For example, two P-N junction diodes may be arranged in an opposite direction to each other, connected in parallel, to form the varistor 42. Therefore, a current may flow from the top electrode 46 to the bottom electrode 40 via the resistor 44 and the varistor 42. If a voltage is applied in an opposite direction, the current may flow from the bottom electrode 40 to the top electrode 46. A resistance of the resistor 44 may be changed by a current applied from the varistor 42. The resistor 44 may act as a data storage layer.

The bottom electrode 40 of the memory device of FIG. 3 may be, for example, formed of platinum (Pt), and the top electrode 46 may be, for example, formed of silver (Ag). However, any suitable conductor may be used to form the electrodes. In an example embodiment, the varistor 42 may be formed of NbO. However, the varistor may be formed of ZnO, $ZnO/Bi_2O_3$, or any suitable material. The resistor 44, which may be used as the data storage layer, may be a resistor having a bipolar characteristic, for example, a resistor formed of $WO_3$, or $CuO_x$. The resistor 44 may also be formed of compound including a metal bonded with an oxygen group element, for example, O, Se or Te and including an oxygen group material, for example, GeTe, GeSe or GeSbTe. In an example embodiment, the resistor 44 may be formed of a unipolar resistive material, for example, NiO.

Figure 4:
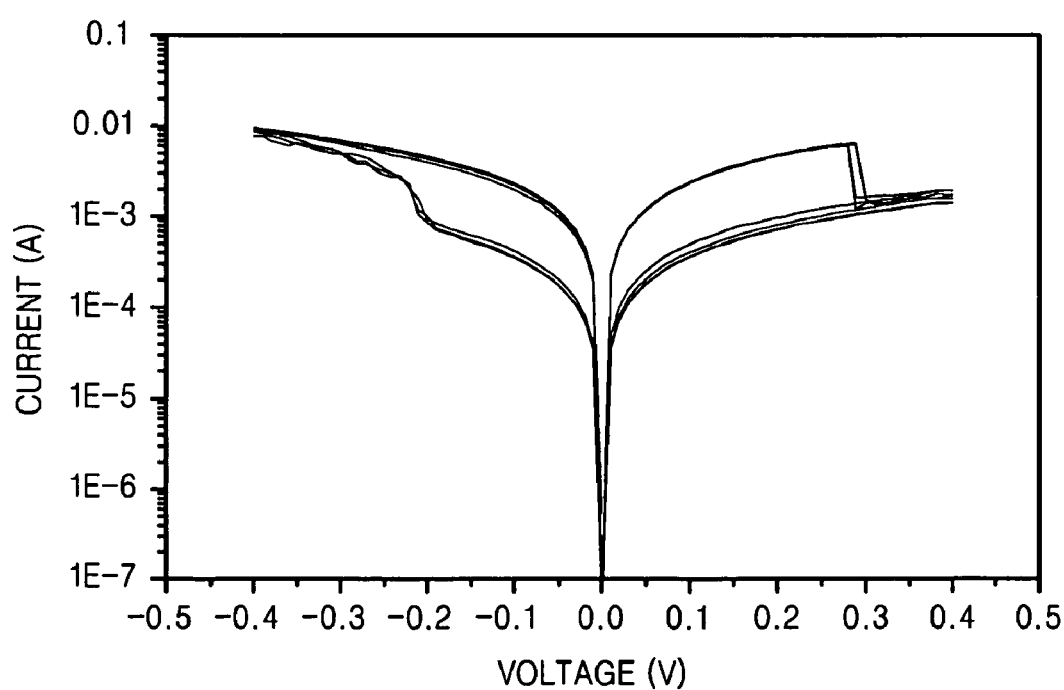
FIG. 4 is a graph showing current-voltage characteristics of a bipolar resistor, according to an example embodiment.

FIG. 4 is a graph showing current-voltage characteristics of a bipolar resistor, according to an example embodiment. The bipolar resistor may be formed of $WO_3$ and may be used as the resistor in a memory device. For example, the bipolar resistor may be used as the data storage layer of the example embodiment of FIG. 3. In order to measure the current-voltage characteristics, a bottom electrode made of platinum and a top electrode made of silver may be used.

Referring to FIG. 4, switching characteristics appear in both the positive and negative voltage regions. In example embodiments, the switching characteristics appearing in the positive voltage region are relatively better than those appearing in the negative voltage region.

Figure 5:
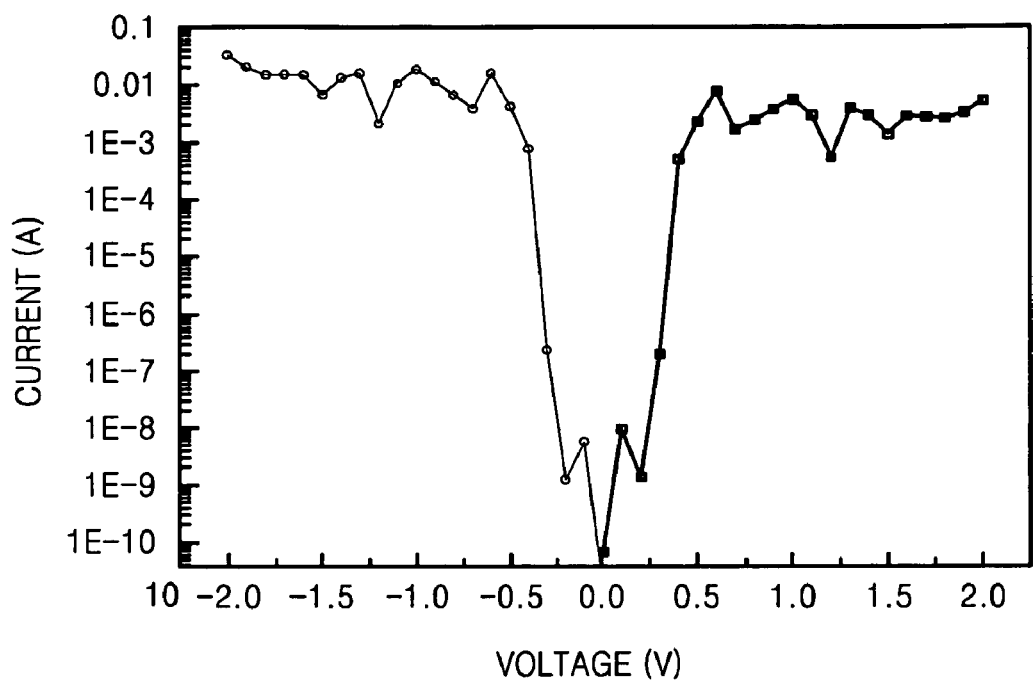
FIG. 5 is a graph showing current-voltage characteristics of a varistor, according to an example embodiment.

FIG. 5 is a graph showing current-voltage characteristics of a varistor, according to an example embodiment. For example, the varistor 42 may be used in the memory device shown in FIG. 3. In order to measure the current-voltage characteristics of the varistor 42, a varistor formed of NbO may be used, and the top and bottom electrodes may be formed of platinum.

Referring to FIG. 5, when a positive voltage applied to the varistor reaches a predetermined or desired threshold voltage, a current flowing through the varistor may increase relatively sharply. In an example embodiment, this may indicate that the varistor acts similar to a conductor when the voltage applied to the varistor reaches the predetermined or desired threshold voltage. Such characteristics of the varistor may appear similarly in the negative voltage region, as illustrated in FIG. 5.

Figure 6:
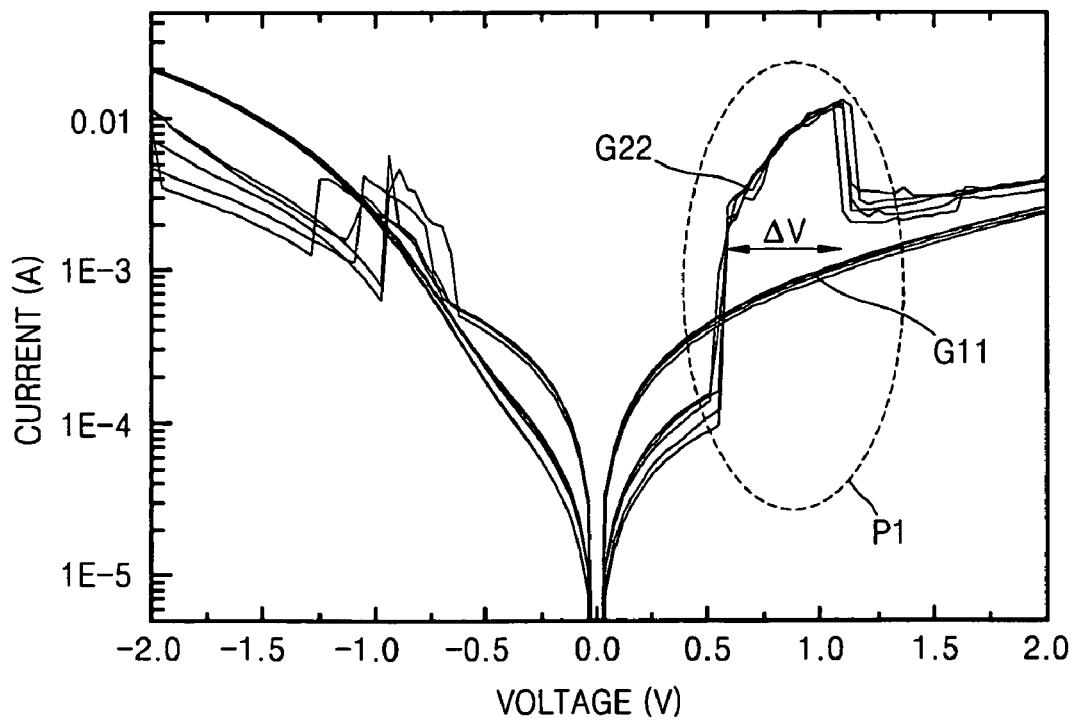
FIG. 6 is a graph showing current-voltage characteristics of a stack structure of a bipolar resistor and a varistor, according to an example embodiment.

FIG. 6 is a graph showing current-voltage characteristics of a stack structure of a bipolar resistor and a varistor, according to an example embodiment. For example, the stack structure may include the resistor having the current-voltage characteristics shown in FIG. 4 and/or the varistor having the current-voltage characteristics shown in FIG. 5.

Referring to FIG. 6, switching characteristics appear in both the negative and positive voltage regions. In an example embodiment, the switching characteristics appearing in the positive voltage region are relatively better than those appearing in the negative voltage region.

A first graph G11 of FIG. 6 shows an initial current-voltage characteristic of a stack structure including an NbO layer as the varistor and a $WO_3$ layer as the resistor, which may be sequentially stacked. A second graph G22 of FIG. 6 shows a current-voltage characteristic of the stack structure when a voltage equal to or higher than a predetermined or desired threshold voltage is applied to the stack structure. The switching characteristics appear at region P1 in the second graph G22 of FIG. 6.

From the measurement results of FIG. 6, it can be seen that the stack structure of the varistor and the resistor have the same or substantially similar switching characteristics as that of a bipolar resistor.

Hereinafter, a method of operating memory devices according to example embodiments will be described with reference to FIG. 3 and FIG. 6. In order to describe methods of operating memory devices, it may be assumed in this example that the resistor 44 of FIG. 3 is in a state which has the current-voltage characteristics shown in the first graph G11 of FIG. 6. That is, it may be regarded that the resistor 44 acts similar to a conductor.

A write voltage (e.g., a threshold voltage) may be applied between the top electrode 46 and the bottom electrode 40. The write voltage may be within the voltage range ($\Delta V$) of the region P1 of the second graph G22 of FIG. 6. If the write voltage is applied to the memory device according to example embodiments, the resistance state of the memory device may follow the second graph G22, and it may be regarded that data 1 is recoded in the memory device.

The resistance of the memory device according to example embodiments may be measured by applying a predetermined or desired read voltage between the top electrode 46 and the bottom electrode 40 of the memory device of FIG. 3. When the read voltage is in the voltage range ($\Delta V$) or is near the right side of the region P1 where the switching characteristics appear, the resistance state of the memory device of example embodiments may change due to the read voltage. As a result, the recorded data may be erased. Therefore, in an example embodiment, the read voltage may be in the left side of the region P1, that is, in between 0V and the voltage range ($\Delta V$) of FIG. 6. The resistance of the memory device, according to example embodiments, as measured by applying the read voltage may be varied depending on the resistance state of the memory device.

For example, when the memory devices of example embodiments by the writing operation have the current-voltage characteristics corresponding to a voltage between 0V and the voltage range ($\Delta V$), the resistance of the memory devices measured by applying the read voltage may be defined as a first resistance. When the memory devices of example embodiments by the writing operation have the current-voltage characteristics corresponding to the voltage range (ΔV) in the second graph G22, the resistance of the memory devices measured by applying the read voltage may be defined as a second resistance. In an example embodiment, the second resistance may be smaller than the first resistance.

The measured resistance may be compared with a reference resistance. The reference resistance may be an intermediate resistance level between the first resistance and the second resistance. In an example embodiment, the first resistance may be greater than the reference resistance. Therefore, when the first resistance is measured by applying the read voltage, it may be regarded that data 0 is read from the memory device, according to example embodiments. In an example embodiment, the second resistance may be smaller than the reference resistance. Therefore, when the second resistance is measured by applying the read voltage, it may be regarded that data 1 is read from the memory device, according to example embodiments.

An erase voltage may be applied between the top electrode 46 and the bottom electrode 40 of FIG. 3. The erasing operation may be to recover the initial state of the memory device from a state following the current-voltage characteristic of the second graph G22, to a state following the current-voltage characteristic of the first graph G11. Therefore, a voltage near the right side of the region P1 showing the switching characteristic in the second graph G22 of FIG. 6 may be applied as the erase voltage. Alternatively, a negative voltage having an absolute value equivalent to the voltage near the right side of the region P1 may be applied as the erase voltage. By applying the erase voltage, the memory device, according to example embodiments may have the initial resistance state.

As described above, a memory device according to example embodiments may include a varistor instead of a diode. Therefore, a positive voltage or a negative voltage may be freely applied according to operations of the memory device. That is, a memory device according to example embodiments may be operated by applying a voltage of different polarities, even when a bipolar resistor is used. Furthermore, as can be appreciated by one of ordinary skill in the art, various changes may be made to example embodiments. For example, the varistor may be formed of different materials or may be oriented differently. Furthermore, the memory devices of example embodiments may be oriented differently, or alternatively, may be used in some other configuration, for example, a grid-like memory array.

While example embodiments have been particularly shown and described, it will be understood by those of ordinary skill in the art that various changes in form and details may be made therein without departing from the spirit and scope of example embodiments as defined by the following claims.

What is claimed is:

1. A memory device comprising:
at least one bottom electrode line;
at least one top electrode line crossing the at least one bottom electrode line; and
at least one stack structure disposed at an intersection of the at least one bottom electrode line and the at least one top electrode line, including a varistor and a data storage layer.

2. The memory device of claim 1, wherein the varistor and the data storage layer are sequentially stacked on the at least one bottom electrode line.

3. The memory device of claim 2, further comprising:
a first conductive layer between the data storage layer and the at least one top electrode line; and
a second conductive layer between the varistor and the at least one bottom electrode line.

4. The memory device of claim 1, wherein the varistor and the data storage layer are sequentially stacked on the at least one top electrode line.

5. The memory device of claim 4, further comprising:
a first conductive layer between the data storage layer and the at least one bottom electrode line; and
a second conductive layer between the varistor and the at least one top electrode line.

6. The memory device of claim 1, further comprising a floating electrode between the varistor and the data storage layer.

7. The memory device of claim 6, wherein the varistor comprises an NbO layer.

8. The memory device of claim 6, wherein the data storage layer is a bipolar resistor or a unipolar resistor.

9. The memory device of claim 1, wherein the varistor comprises two diodes, connected in parallel and in opposite directions.

10. The memory device of claim 9, wherein the two diodes are P-N junction diodes.

11. The memory device of claim 1, wherein the varistor includes an NbO layer.

12. The memory device of claim 1, wherein the varistor includes at least one of ZnO and $Bi_2O_3$.

13. The memory device of claim 1, wherein the data storage layer is at least one of a unipolar resistor and a bipolar resistor.

14. The memory device of claim 13, wherein the bipolar resistor includes $WO_3$.

15. The memory device of claim 1, wherein the data storage layer includes at least one of GeTe, GeSe, GeSeTe, and NiO.

16. The memory device of claim 1, wherein:
the at least one top electrode line includes platinum; and
the at least one bottom electrode line includes silver.

17. The memory device of claim 1, wherein:
the at least one top electrode line includes a plurality of top electrode lines arranged in parallel; and
the at least one bottom electrode line includes a plurality of bottom electrode lines arranged in parallel, wherein the plurality of bottom electrode lines are substantially perpendicular to the plurality of top electrode lines.

18. The memory device of claim 17, wherein the at least one stack structure includes a plurality of stack structures, each one of the plurality of stack structures disposed at a different intersection of the plurality of bottom electrode lines and the plurality of top electrode lines.

19. The memory device of claim 18, wherein the plurality of stack structures each includes a varistor and a data storage layer.

20. A method of operating a memory device, comprising:
providing the memory device including at least one bottom electrode line, at least one top electrode line crossing the at least one bottom electrode line, and at least one stack structure disposed at an intersection of the at least one bottom electrode line and the at least one top electrode line, including a varistor and a data storage layer; and
applying a voltage between the bottom electrode line and the top electrode line.

21. The method of claim 20, wherein the voltage is selected from the group consisting of a write voltage, a read voltage, and an erase voltage.

22. The method of claim 20, further comprising:
measuring a resistance of the memory device by applying a read voltage; and
comparing the measured resistance with a reference resistance.

23. The method of claim 20, wherein a floating electrode is further disposed between the varistor and the data storage layer.

24. The method of claim 20, wherein the varistor comprises an NbO layer.

25. The method of claim 20, wherein the data storage layer is a bipolar resistor or a unipolar resistor.

26. The method of claim 25, wherein the bipolar resistor comprises $WO_3$.

27. The method of claim 23, wherein the varistor comprises an NbO layer.

28. The method of claim 23, wherein the data storage layer is a bipolar resistor or a unipolar resistor.

* * * * *